(12) United States Patent
Yu et al.

(10) Patent No.: US 10,321,560 B2
(45) Date of Patent: Jun. 11, 2019

(54) DUMMY CORE PLUS PLATING RESIST RESTRICT RESIN PROCESS AND STRUCTURE

(71) Applicant: Multek Technologies Limited, San Jose, CA (US)

(72) Inventors: Pui Yin Yu, Tsuen Wan (HK); Mark Zhang, Guangdong (CN); Jiawen Chen, Guangdong (CN)

(73) Assignee: Multek Technologies Limited, San Jose, CA (US)

( * ) Notice: Subject to any disclaimer, the term of this patent is extended or adjusted under 35 U.S.C. 154(b) by 0 days.

(21) Appl. No.: 14/995,087

(22) Filed: Jan. 13, 2016

(65) Prior Publication Data

US 2017/0142828 A1    May 18, 2017

(30) Foreign Application Priority Data

Nov. 12, 2015    (CN) .......................... 2015 1 0770530

(51) Int. Cl.
  *H05K 1/02*    (2006.01)
  *H05K 1/11*    (2006.01)
  (Continued)

(52) U.S. Cl.
  CPC ......... *H05K 1/0278* (2013.01); *H05K 1/0298* (2013.01); *H05K 1/115* (2013.01);
  (Continued)

(58) Field of Classification Search
  CPC .... H05K 1/0278; H05K 3/067; H05K 1/0298; H05K 3/181; H05K 3/4611; H05K 1/115; H05K 2203/0574; H05K 2203/06
  See application file for complete search history.

(56) References Cited

U.S. PATENT DOCUMENTS

| | | |
|---|---|---|
| 3,739,232 A | 6/1973 | Grossman |
| 3,755,061 A | 8/1973 | Schurb |

(Continued)

FOREIGN PATENT DOCUMENTS

| | | |
|---|---|---|
| JP | 2008078454 A | 4/2008 |
| JP | 2015012022 A | 1/2015 |

(Continued)

OTHER PUBLICATIONS

Final office action dated Jun. 27, 2017, U.S. Appl. No. 15/064,437, filed Mar. 8, 2016 applicant.: JL Zhou, 21 pages.

(Continued)

*Primary Examiner* — Ishwarbhai B Patel
(74) *Attorney, Agent, or Firm* — Haverstock & Owens LLP

(57) ABSTRACT

A printed circuit board (PCB) has multiple layers, where select portions of inner layer circuitry, referred to as inner core circuitry, are exposed from the remaining layers. The PCB having an exposed inner core circuitry is formed using a dummy core plus plating resist process. The select inner core circuitry is part of an inner core. The inner core corresponding to the exposed inner core circuitry forms a semi-flexible PCB portion. The semi-flexible PCB portion is an extension of the remaining adjacent multiple layer PCB. The remaining portion of the multiple layer PCB is rigid. The inner core is common to both the semi-flexible PCB portion and the remaining rigid PCB portion.

8 Claims, 12 Drawing Sheets

US 10,321,560 B2

Page 2

(51) Int. Cl.
*H05K 3/46* (2006.01)
*H05K 3/06* (2006.01)
*H05K 3/18* (2006.01)
*H05K 1/03* (2006.01)

(52) U.S. Cl.
CPC .............. *H05K 3/067* (2013.01); *H05K 3/181* (2013.01); *H05K 3/4611* (2013.01); *H05K 1/0393* (2013.01); *H05K 1/118* (2013.01); *H05K 2203/0574* (2013.01); *H05K 2203/06* (2013.01)

(56) References Cited

U.S. PATENT DOCUMENTS

| | | | |
|---|---|---|---|
| 3,834,823 A | 9/1974 | Seregely | |
| 4,055,424 A | 10/1977 | Chu | |
| 4,069,497 A | 1/1978 | Steidlitz | |
| 4,338,149 A | 7/1982 | Quaschner | |
| 4,356,619 A | 11/1982 | Snyder | |
| 4,447,286 A | 5/1984 | Weglin | |
| 4,518,833 A | 5/1985 | Watkins | |
| 4,568,629 A | 2/1986 | Kinashi | |
| 4,670,351 A | 6/1987 | Keane | |
| 4,691,419 A | 9/1987 | Keeler | |
| 4,711,026 A | 12/1987 | Swiggett | |
| 4,712,160 A | 12/1987 | Sato et al. | |
| 4,726,114 A | 2/1988 | Staviski | |
| 4,795,512 A | 1/1989 | Nakatani | |
| 4,828,961 A | 5/1989 | Lau | |
| 4,899,256 A | 2/1990 | Sway-Tin | |
| 4,941,516 A | 7/1990 | Weiswurm | |
| 5,004,639 A | 4/1991 | Desai | |
| 5,101,322 A | 3/1992 | Ghaem et al. | |
| 5,116,440 A | 5/1992 | Takeguchi | |
| 5,121,297 A | 6/1992 | Haas | |
| 5,153,050 A | 10/1992 | Johnston | |
| 5,175,047 A | 12/1992 | McKenney | |
| 5,206,463 A * | 4/1993 | DeMaso | H05K 3/4691 174/254 |
| 5,227,223 A | 7/1993 | Morgan | |
| 5,235,491 A | 8/1993 | Weiss | |
| 5,272,599 A | 12/1993 | Koenen | |
| 5,295,044 A | 3/1994 | Araki et al. | |
| 5,347,712 A | 9/1994 | Yasuda | |
| 5,365,403 A | 11/1994 | Vinciarelli et al. | |
| 5,409,884 A | 4/1995 | harada | |
| 5,536,677 A | 7/1996 | Hutbacher | |
| 5,784,782 A | 7/1998 | Boyko | |
| 5,838,554 A | 11/1998 | Lanni | |
| 5,872,051 A | 2/1999 | Fallon et al. | |
| 5,873,512 A | 2/1999 | Bielick et al. | |
| 5,876,859 A | 3/1999 | Saxelby, Jr. | |
| 5,920,458 A | 7/1999 | Azar | |
| 5,933,324 A | 8/1999 | Barrett | |
| 6,031,281 A | 2/2000 | Kang | |
| 6,090,237 A | 7/2000 | Reynolds | |
| 6,189,771 B1 | 2/2001 | Maeda et al. | |
| 6,214,525 B1 | 4/2001 | Boyko | |
| 6,243,269 B1 | 6/2001 | Dibene, II et al. | |
| 6,245,595 B1 | 6/2001 | Nguyen | |
| 6,272,015 B1 | 8/2001 | Mangtani | |
| 6,282,092 B1 | 8/2001 | Okamoto et al. | |
| 6,311,139 B1 | 10/2001 | Kuroda et al. | |
| 6,369,328 B1 | 4/2002 | Munakata | |
| 6,459,493 B1 | 10/2002 | Sugiura | |
| 6,541,712 B1 | 4/2003 | Gately et al. | |
| 6,549,409 B1 | 4/2003 | Saxelby et al. | |
| 6,775,162 B2 | 8/2004 | Mihai et al. | |
| 6,795,315 B1 | 9/2004 | Wu et al. | |
| 7,037,561 B2 | 5/2006 | Narita | |
| 7,208,833 B2 | 4/2007 | Nobori et al. | |
| 7,313,464 B1 | 12/2007 | Perreault | |
| 7,576,288 B2 | 8/2009 | Kondo | |
| 7,676,775 B2 | 3/2010 | Chen et al. | |
| 7,898,068 B2 | 3/2011 | Smeys | |
| 8,020,292 B1 | 9/2011 | Kumar | |
| 8,042,445 B2 * | 10/2011 | Lin | H05K 3/0044 83/128 |
| 8,222,537 B2 | 7/2012 | Dudnikov, Jr. | |
| 8,302,301 B2 | 11/2012 | Lau | |
| 8,519,270 B2 * | 8/2013 | Chang | H05K 3/4697 174/250 |
| 8,558,116 B2 | 10/2013 | Lee | |
| 8,707,221 B2 | 4/2014 | Durkan | |
| 8,735,739 B2 | 5/2014 | Ishihara | |
| 8,882,954 B2 * | 11/2014 | Lee | H05K 3/4644 156/247 |
| 8,884,166 B2 | 11/2014 | Inatani | |
| 9,338,899 B2 * | 5/2016 | Lee | H05K 3/429 |
| 2001/0003427 A1 | 6/2001 | Ferguson et al. | |
| 2001/0018263 A1 | 8/2001 | Ochiai et al. | |
| 2001/0045297 A1 | 11/2001 | Miller et al. | |
| 2002/0008963 A1 | 1/2002 | DiBene, II et al. | |
| 2002/0092160 A1 | 7/2002 | McCullough | |
| 2003/0007161 A1 | 1/2003 | Bowles | |
| 2003/0164077 A1 | 9/2003 | Hill | |
| 2004/0089472 A1 | 5/2004 | Ninomiya | |
| 2004/0122606 A1 | 6/2004 | Cohen et al. | |
| 2004/0144527 A1 | 7/2004 | Yang et al. | |
| 2004/0219342 A1 | 11/2004 | Boggs | |
| 2005/0005996 A1 | 1/2005 | Mizutani | |
| 2005/0246590 A1 | 11/2005 | Lancaster | |
| 2006/0043567 A1 | 3/2006 | Palanduz | |
| 2006/0181715 A1 | 8/2006 | Bristow | |
| 2006/0196642 A1 | 9/2006 | Gharib | |
| 2007/0017697 A1 | 1/2007 | Hsu | |
| 2007/0054104 A1 | 3/2007 | Ittel | |
| 2007/0117261 A1 * | 5/2007 | Ueno | H05K 3/4691 438/106 |
| 2007/0177075 A1 | 8/2007 | Kimoto | |
| 2007/0198548 A1 | 8/2007 | Lee | |
| 2007/0246254 A1 | 10/2007 | Kumar | |
| 2007/0272435 A1 | 11/2007 | Johnson | |
| 2007/0273011 A1 | 11/2007 | Singleton et al. | |
| 2008/0217708 A1 | 9/2008 | Reisner | |
| 2008/0217768 A1 | 9/2008 | Miranda et al. | |
| 2008/0224026 A1 | 9/2008 | Pasternak | |
| 2008/0253612 A1 | 10/2008 | Reyier | |
| 2008/0301597 A1 | 12/2008 | Chen et al. | |
| 2009/0004438 A1 | 1/2009 | Urakawa | |
| 2009/0014501 A1 | 1/2009 | Nishi et al. | |
| 2009/0257707 A1 | 10/2009 | Shibata | |
| 2010/0159765 A1 | 6/2010 | Jian | |
| 2010/0181104 A1 * | 7/2010 | Hotta | H05K 3/421 174/266 |
| 2010/0288540 A1 | 11/2010 | Honjo | |
| 2011/0307752 A1 | 12/2011 | Fuji et al. | |
| 2012/0104591 A1 | 5/2012 | Warren | |
| 2012/0181074 A1 * | 7/2012 | Ishihara | H05K 3/4691 174/261 |
| 2012/0234587 A1 | 9/2012 | Nakamura | |
| 2012/0305775 A1 | 12/2012 | Krolak | |
| 2013/0299223 A1 | 11/2013 | Yoo | |
| 2013/0341078 A1 | 12/2013 | Hardin | |
| 2014/0092379 A1 | 4/2014 | Niiranen | |
| 2014/0185060 A1 | 7/2014 | Doerband | |
| 2014/0192346 A1 | 7/2014 | Vandervalk | |
| 2014/0301053 A1 | 10/2014 | Lida | |
| 2014/0355006 A1 | 12/2014 | Hotta | |
| 2014/0355009 A1 | 12/2014 | Lin | |
| 2015/0014029 A1 * | 1/2015 | Iwayama | H05K 3/184 174/257 |
| 2015/0047884 A1 * | 2/2015 | Nagaura | H05K 3/388 174/255 |
| 2015/0090688 A1 | 4/2015 | Ajoian | |
| 2015/0376444 A1 | 12/2015 | Saito | |
| 2016/0021762 A1 | 1/2016 | Kallman | |
| 2016/0088729 A1 | 3/2016 | Kobuke | |
| 2016/0093540 A1 | 3/2016 | Liu | |
| 2016/0324012 A1 | 11/2016 | Qiu | |
| 2017/0131701 A1 | 5/2017 | Nelson | |
| 2017/0265298 A1 | 9/2017 | Zhang | |

(56) References Cited

U.S. PATENT DOCUMENTS

FOREIGN PATENT DOCUMENTS

| KR | 10-0887133 B1 | 3/2009 |
| KR | 100891814 | 3/2009 |
| KR | 10-0891814 B1 | 4/2009 |

OTHER PUBLICATIONS

Non-Final office Action dated Nov. 1, 2017, U.S. Appl. No. 15/367,679, filed Dec. 2, 2016, applicant: Joan K. Vrtis, 28 pages.
Non-Final Office Action, dated May 1, 2018, U.S. Appl. No. 15/159,665, filed May 19, 2016, Applicant: Jiawen Chen, 8 pages.
Non Final Office Action, dated Feb. 27, 2018, U.S. Appl. No. 15/087,793, filed Mar. 31, 2016, Applicant: Pui Yin Yu, 11 pages.
Non-Final Office Action, dated May 25, 2018, U.S. Appl. No. 15/816,971, filed Nov. 17, 2017, Applicant: Michael James Glickman, 15 pages.

\* cited by examiner

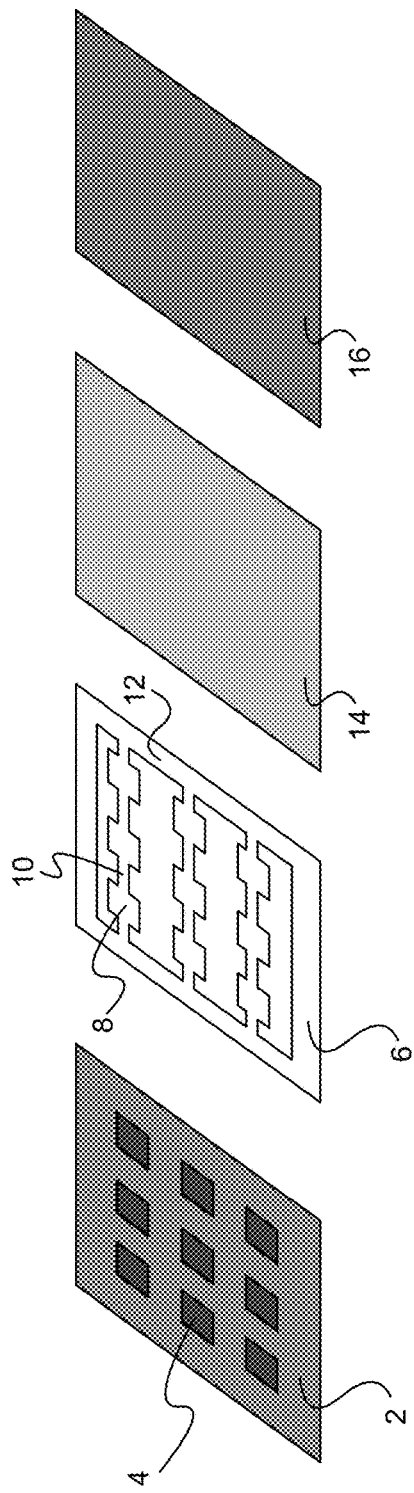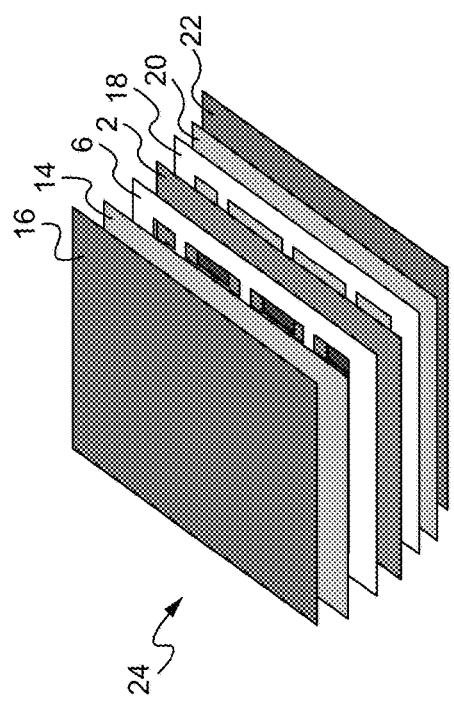

DUMMY CORE PLUS PLATING RESIST RESTRICT RESIN PROCESS AND STRUCTURE

CROSS-REFERENCE TO RELATED APPLICATION(S)

This application claims priority under 35 U.S.C. § 119 (a)-(d) of the Chinese Patent Application No: 201510770530.9, filed Nov. 12, 2015 and titled, "DUMMY CORE PLUS PLATING RESIST RESTRICT RESIN PROCESS AND STRUCTURE," which is hereby incorporated by reference in its entirety for all purposes.

FIELD OF THE INVENTION

The present invention is generally directed to printed circuit boards. More specifically, the present invention is directed to printed circuit boards having select exposure of inner layer circuitry.

BACKGROUND OF THE INVENTION

A printed circuit board (PCB) mechanically supports and electrically connects electronic components using conductive traces, pads and other features etched from electrically conductive sheets, such as copper sheets, laminated onto a non-conductive substrate. Multi-layered printed circuit boards are formed by stacking and laminating multiple such etched conductive sheet/non-conductive substrate. Conductors on different layers are interconnected with plated-through holes called vias.

A printed circuit board includes a plurality of stacked layers, the layers made of alternating non-conductive layers and conductive layers. The non-conductive layers can be made of prepreg or base material that is part of a core structure, or simply core. Prepreg is a fibrous reinforcement material impregnated or coated with a thermosetting resin binder, and consolidated and cured to an intermediate stage semi-solid product. Prepreg is used as an adhesive layer to bond discrete layers of multilayer PCB construction, where a multilayer PCB consists of alternative layers of conductors and base materials bonded together, including at least one internal conductive layer. A base material is an organic or inorganic material used to support a pattern of conductor material. A core is a metal clad base material where the base material has integral metal conductor material on one or both sides. A laminated stack is formed by stacking multiple core structures with intervening prepreg and then laminating the stack. A via is then formed by drilling a hole through the laminated stack and plating the wall of the hole with electrically conductive material, such as copper. The resulting plating interconnects the conductive layers. In some applications, the plating extends uninterrupted through the entire thickness of the via and each conductive layer is connected to the plating, thereby providing a common interconnection with each and every conductive layer. In other applications, it may be desired that only certain conductive layers be commonly interconnected by the plating within the via.

SUMMARY OF THE INVENTION

Embodiments are directed to a printed circuit board having multiple layers, where select portions of inner layer circuitry, referred to as inner core circuitry, are exposed from the remaining layers. The printed circuit board having an exposed inner core circuitry is formed using a dummy core plus plating resist process. The select inner core circuitry is part of an inner core. During manufacturing of the printed circuit board, a plating resist is applied over the select inner core circuitry and a dummy core is applied over the plating resist. The plating resist and the dummy core protect the select inner core circuitry during subsequent process steps and also enable exposure of the select inner core circuitry as described in detail below. In some embodiments, the inner core corresponding to the exposed inner core circuitry forms a semi-flexible, or semi-flex, PCB portion. The semi-flex PCB portion is an extension of the remaining adjacent multiple layer PCB. The remaining portion of the multiple layer PCB is rigid, referred to as the rigid PCB portion. The inner core is a layer(s) of the printed circuit board and is therefore common to both the semi-flex PCB portion and the remaining rigid PCB portion. The semi-flex PCB portion can be formed as an interior portion of the printed circuit board such that a rigid PCB portion is coupled to either end of the semi-flex PCB portion. In other embodiments, the portion of the printed circuit board corresponding to the exposed inner core circuitry is rigid, referred to as a rigid exposed circuitry PCB portion. The rigid exposed circuitry PCB portion can be formed at the perimeter of the printed circuit board such that one end of the rigid exposed circuitry PCB portion is coupled to a rigid PCB portion and the other end of the rigid exposed circuitry PCB portion is uncoupled, for example forming one or more recessed gold finger connectors.

In an aspect, a printed circuit board is disclosed. The printed circuit board includes a rigid printed circuit board portion and a semi-flexible printed circuit board portion. The rigid printed circuit board portion includes a laminated stack of a plurality of non-conducting layers and a plurality of conductive layers, wherein the laminated stack further includes a first portion of an inner core structure. The semi-flexible printed circuit board portion includes a second portion of the inner core structure, wherein the inner core structure is a continuous structure that extends through both the rigid printed circuit board portion and the semi-flexible printed circuit board portion, further wherein the second portion of the inner core structure includes exposed inner core circuitry and plating resist material. In some embodiments, each of the conductive layers is pattern etched. In some embodiments, the printed circuit board also includes one or more plated through hole vias in the rigid printed circuit board portion. In some embodiments, the rigid printed circuit board portion includes a first rigid printed circuit board portion, further wherein the printed circuit board further includes a second rigid printed circuit board portion including a second laminated stack of a plurality of non-conducting layers and a plurality of conductive layers, wherein the second laminated stack further includes a third portion of an inner core structure. In some embodiments, the inner core structure includes an inner core non-conductive layer having a first surface and a first conductive layer positioned on the first surface of the inner core non-conductive layer. In some embodiments, the first conductive layer of the inner core structure includes the inner core circuitry in the second portion of the inner core structure. In some embodiments, the inner core non-conductive layer has a second surface opposing the first surface, further wherein the inner core structure further includes a second conductive layer positioned on the second surface of the inner core non-conductive layer. In some embodiments, the second conductive layer of the inner core structure includes the inner core circuitry in the second portion of the inner core structure.

In another aspect, a printed circuit board set form is disclosed. The printed circuit board set form comprises a plurality of printed circuit boards and a breakaway substrate. The plurality of printed circuit boards are aligned within a common plane, wherein each printed circuit board is mechanically connected by a common substrate. Each printed circuit board comprises a rigid printed circuit board portion and a semi-flexible printed circuit board portion. The rigid printed circuit board portion comprises a laminated stack of a plurality of non-conducting layers and a plurality of conductive layers, wherein the laminated stack further comprises a first portion of an inner core structure. The semi-flexible printed circuit board portion comprises a second portion of the inner core structure, wherein the inner core structure is a continuous structure that extends through both the rigid printed circuit board portion and the semi-flexible printed circuit board portion, further wherein the second portion of the inner core structure comprises exposed inner core circuitry and plating resist material. The breakaway substrate is aligned within the common plane and is mechanically connected around a perimeter of the connected plurality of printed circuit boards, wherein the breakaway substrate includes a dummy core portion. In some embodiments, the breakaway substrate provides lateral structural stability to the connected plurality of printed circuit boards. In some embodiments, the plurality of printed circuit boards are electrically isolated from each other. In some embodiments, each of the conductive layers is pattern etched. In some embodiments, the printed circuit board set form further comprises one or more plated through hole vias in the rigid circuit board portion. In some embodiments, the rigid printed circuit board portion comprises a first rigid printed circuit board portion, further wherein the printed circuit board further comprises a second rigid printed circuit board portion comprising a second laminated stack of a plurality of non-conducting layers and a plurality of conductive layers, wherein the second laminated stack further comprises a third portion of an inner core structure. In some embodiments, the inner core structure comprises an inner core non-conductive layer having a first surface and a first conductive layer positioned on the first surface of the inner core non-conductive layer. In some embodiments, the first conductive layer of the inner core structure comprises the inner core circuitry in the second portion of the inner core structure. In some embodiments, the inner core non-conductive layer has a second surface opposing the first surface, further wherein the inner core structure further comprises a second conductive layer positioned on the second surface of the inner core non-conductive layer. In some embodiments, the second conductive layer of the inner core structure comprises the inner core circuitry in the second portion of the inner core structure.

In yet another aspect, a method of manufacturing a printed circuit board is disclosed. The method comprises forming an inner core structure having an inner core circuitry on at least one surface of the inner core structure, applying a plating resist over the inner core circuitry, and forming a printed circuit board stack up, wherein the printed circuit board stack up comprises the inner core structure, a dummy core, one or more non-conductive layers and one or more conductive layers. The dummy core is stacked on the plating resist. The method further comprises laminating the printed circuit board stack up, thereby forming a laminated stack, forming a depth controlled rout from a surface of the laminated stack to the dummy core and around a perimeter of the dummy core, wherein a portion of the laminated stack within the perimeter of the rout and to a depth including the dummy core forms a laminated stack cap. The method further comprises removing the laminated stack cap, thereby exposing the plating resist, and stripping the plating resist, thereby exposing the inner core circuitry. In some embodiments, stripping the plating resist leaves a residual portion of plating resist. In some embodiments, the perimeter of the dummy core corresponds to a perimeter of the inner core circuitry. In some embodiments, the method further comprises forming the dummy core, wherein the dummy core comprises a non-conductive layer and a conductive layer. In some embodiments, the dummy core is stacked on the plating resist such that the conductive layer of the dummy core contacts the plating resist. In some embodiments, the method further comprises forming at least one plated through hole via in the laminated stack prior to forming the depth controlled rout, wherein the at least one plated through hole via is not aligned within the inner core circuitry. In some embodiments, the method further comprises pattern etching the conductive layers in the laminated stack prior to forming the printed circuit board stack up. In some embodiments, forming the inner core structure comprises applying a first conductive layer on a first surface of a non-conductive layer and applying a second conductive layer on a second surface of the non-conductive layer. In some embodiments, the first conductive layer is pattern etched and the second conductive layer is pattern etched.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures:

FIG. 1 illustrates a perspective top view of various layers included in a printed circuit board prior to stacking and lamination according to some embodiments.

FIG. 2 illustrates an exemplary PCB stack-up 24 according to some embodiments.

DETAILED DESCRIPTION OF THE EMBODIMENTS

Figure 3:
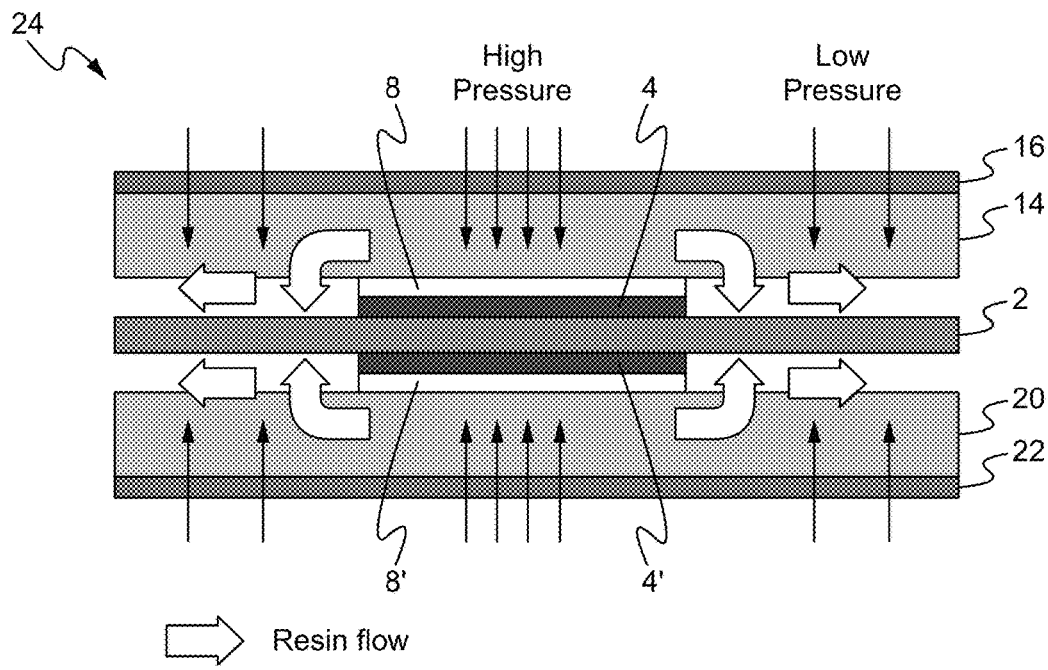
FIG. 3 illustrates a cut out side view of a portion of the PCB-stack-up shown in FIG. 2 as a lamination step is performed.

Embodiments of the present application are directed to a printed circuit board. Those of ordinary skill in the art will realize that the following detailed description of the printed circuit board is illustrative only and is not intended to be in any way limiting. Other embodiments of the printed circuit board will readily suggest themselves to such skilled persons having the benefit of this disclosure.

Reference will now be made in detail to implementations of the printed circuit board as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

FIG. 1 illustrates a perspective top view of various layers included in a printed circuit board prior to stacking and lamination according to some embodiments. An inner core 2 includes multiple layers (not shown). In some embodiments, the inner core 2 includes a non-conductive layer, such as prepreg or a base material, and a conductive layer on each surface of the non-conductive layer. It is understood that alternative inner core structures can be use which include a conductive layer on only one surface of the non-conductive layer. The conductive layers are patterned and etched to form conductive interconnects. Select portions of the conductive interconnects, referred to as inner core circuitry, are to be part of semi-flex PCBs. Each select portion is coated by plating resist 4.

The dummy core 6 protects the select inner core circuitry covered by the applied plating resist. In some embodiments, the dummy core 6 is a two-layer structure. A first layer is a non-conductive layer, such as a base material. The second layer is a conductive layer, such as a copper foil. The dummy core 6 is shaped similar to an inverted stencil where the stencil pattern is formed of the dummy core material and the area surrounding the pattern is free of material. The pattern of the dummy core 6 includes overlay portions 8 that have substantially the same shape and size as the areas of applied plating resist 4. The pattern of the dummy core 6 also includes interconnect portions 10 that connect the overlay portions 8 and an outer perimeter portion 12. The interconnect portions 10 and the outer perimeter portion 12 of the dummy core pattern provide a stable framework for accurately placing the overlay portions 8 relative to the plating resist 4.

A layer 14 is a non-conductive, insulating layer, such as prepreg. A layer 16 is a conductive layer, such as copper foil or laminate, where a laminate is similar in structure to the inner core 2 and includes a non-conductive layer such as base material and a conductive layer on one or both sides of non-conductive layer. In some embodiments, the layer 16 is representative of a multilayer buildup that can include many interspersed conductive and non-conductive layers.

A PCB stack-up is formed by stacking various combinations of the layers, or similar to the layers, shown in FIG. 1. FIG. 2 illustrates an exemplary PCB stack-up 24 according to some embodiments. The stack-up 24 includes the inner core 2, the dummy core pattern 6, the non-conductive layer 14, the conductive layer 16, a dummy core pattern 18, a non-conductive layer 20 and a conductive layer 22. The dummy core pattern 18 can be patterned the same as the dummy core pattern 6 or differently depending on the inner core circuitry and plating resist patterns applied on a back side (not shown) of the inner core 2. The non-conductive layer 20 can be similar to the non-conductive layer 14. The conductive layer 22 can have the same or different patterned interconnects as the conductive layer 16. The conductive layer 16 can represent a single layer or a multilayer buildup, and the conductive layer 22 can represent a single layer or multilayer buildup independently configured than the conductive layer 16.

Figure 4:
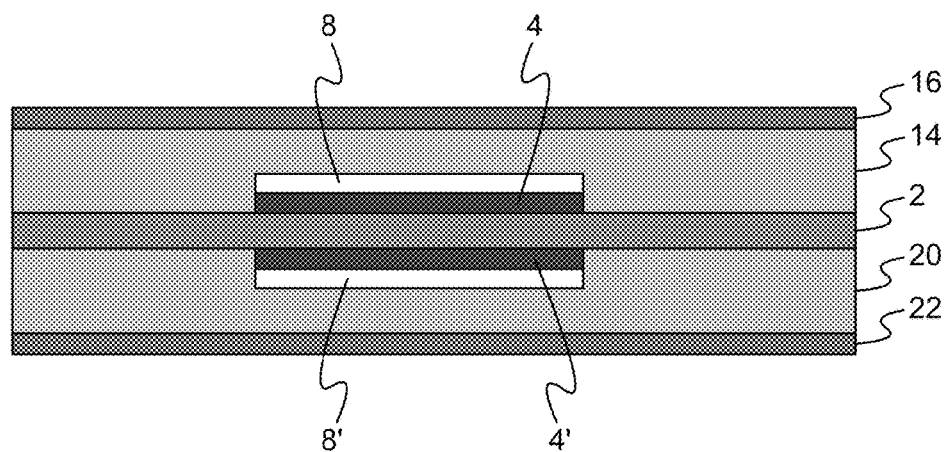
FIG. 4 illustrates a cut out side view of the PCB stack-up of FIG. 3 after lamination.

A laminated stack is formed by laminating the PCB stack-up shown in FIG. 2. Any conventional lamination technique can be used. FIG. 3 illustrates a cut out side view of a portion of the PCB-stack-up shown in FIG. 2 as a lamination step is performed. The portion of the PCB stack-up shown in FIG. 3 coincides with an overly portion 8 of the dummy core pattern 6 and a plating resist portion 4 applied over inner core circuitry of the inner core 2. An overlay portion 8' of the dummy core pattern 18 of FIG. 2 and a plating resist portion 4' applied over backside inner core circuitry of the inner core 2 is also shown. With the dummy core positioned on the plating resist, the dummy core touches firmly with the plating resist under lamination pressure. A total thickness of the dummy core and plating resist is thicker than an adjacent area such that prepreg resin flows into the adjacent area under lower pressure. Prepreg resin flow into the inner core circuitry is restricted by the dummy core and plating resist as well as the higher pressure. The plating resist and the dummy core provide structural support during the lamination step so as to provide protection to the inner core circuitry. FIG. 4 illustrates a cut out side view of the PCB stack-up of FIG. 3 after lamination.

Figure 5:
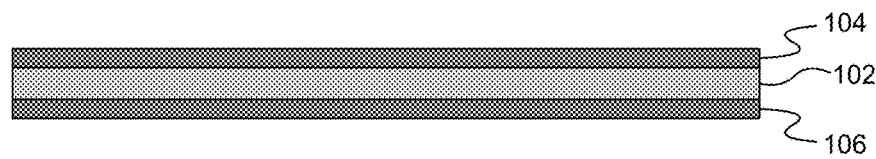
FIGS. 5-14 illustrate various steps in the process used to manufacture a printed circuit board according to some embodiments.

FIGS. 5-14 illustrate various steps in the process used to manufacture a printed circuit board according to some embodiments. The printed circuit board manufactured using the various steps shown in FIGS. 5-14 is similar to and shares features of the printed circuit boards and constituent layers shown in FIGS. 1-4. Each of the FIGS. 5-14 illustrate a cut out side view of the printed circuit board according to the various process steps. In FIG. 5, an exemplary inner core structure is shown. The inner core structure is a metal clad base material including a non-conductive base material layer 102 and conductive layers 104, 106 formed on both opposing surfaces. It is understood that an alternative inner core structure can be used which includes a conductive layer on only one surface of the non-conductive layer.

Figure 6:
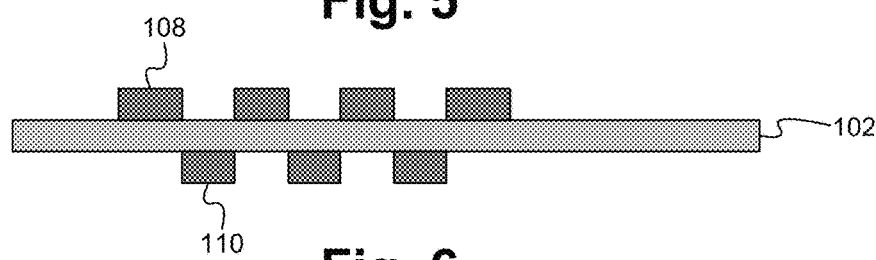

In FIG. 6, the conductive layers 104 and 106 are selectively pattern etched to form inner core circuitry 108 and 110, respectively. Alternatively, the conductive layers 104, 106 are already pattern etched during fabrication of the inner core structure in FIG. 5. It is understood that FIG. 5-14 only show a portion of the printed circuit board and in particular only show a portion of the inner core structure. Additional interconnects and circuitry may be formed on portions of the inner core structure not shown in FIGS. 5-14, those portions to be included as part of a rigid PCB portion of the printed circuit board.

Figure 7:
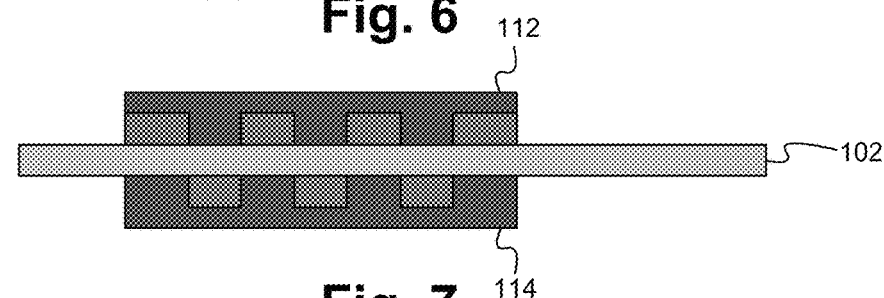

In FIG. 7, plating resist 112, 114, such as liquid photoimageable plating resist, is applied on the inner core circuitry 108 and 110, respectively. The resulting structure forms an inner core assembly. It is understood that other types of plating resist can be used that have a low adhesion to a conductive layer, such as copper, of a dummy core as described in detail below. In some embodiments, a portion of the plating resist 112, 114 may extend beyond the outer edges of the inner core circuitry 108, 110 so as to encapsulate the inner core circuitry 108, 110. For example, the plating resist 112 may extend more laterally than shown in FIG. 7 so as to encapsulate inner core circuitry 108 similar to the manner that inner core circuitry 110 is shown in FIG. 7 to be encapsulated.

Figure 8:
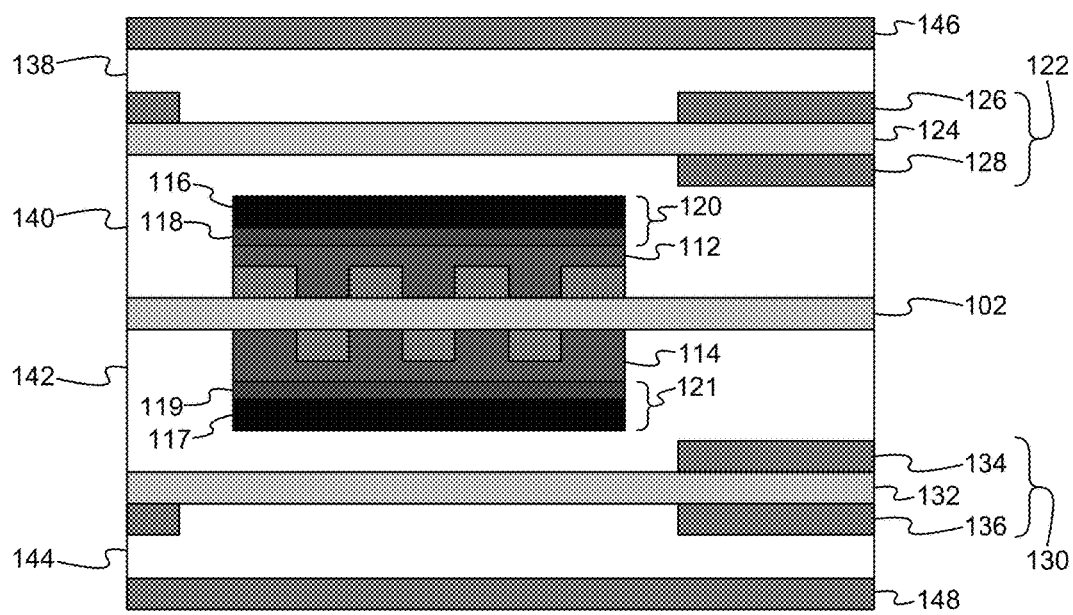

In FIG. 8, additional core structures and dummy core structures are fabricated, and the core structures, the inner core assembly and the dummy core structures are stacked with intervening non-conductive layers. The additional core structures are similar to the inner core structure of FIG. 5 with the conductive layers pattern etched accordingly. However, the conductive layers of the additional core structures are formed such that the resulting interconnects will be positioned in a rigid PCB portion of the resulting printed circuit board. In the exemplary configuration shown in FIG. 8, two additional core structures are included. A first core structure 122 includes a non-conductive layer 124 and conductive layers 126 and 128. The conductive layers 126 and 128 are selectively pattern etched. As shown in FIG. 8, the portions of the conductive layers 126 and 128 aligned with the inner core circuitry 108 are removed. However, removal of the conductive layers 126 and 128 is optional and in other embodiments these portions of the conductive layers 126 and 128 may remain. A second core structure 130 includes a non-conductive layer 132 and conductive layers 134 and 136. The conductive layers 134 and 136 are selectively pattern etched. As shown in FIG. 8, the portions of the conductive layers 134 and 136 aligned with the inner core circuitry 110 are removed. However, removal of the conductive layers 134 and 136 is optional and in other embodiments these portions of the conductive layers 134 and 136 may remain.

A dummy core 120 is positioned on the plating resist 112 of the inner core assembly and a dummy core 121 is positioned on the plating resist 114 of the inner core assembly. The dummy core 120 includes a conductive layer 118 and a non-conductive layer 116, the dummy core 120 is oriented such that the conductive layer 118 is positioned against the plating resist 112. The type of plating resist used has a low adhesion to the material type of the conductive layer 118. This low adhesion enables removal of the dummy core 120 from the inner core assembly during a subsequent decap step shown and described in relation to FIG. 13. The dummy core 121 includes a conductive layer 119 and a non-conductive layer 117, the dummy core 121 is oriented such that the conductive layer 119 is positioned against the plating resist 114. The type of plating resist used has a low adhesion to the material type of the conductive layer 119. This low adhesion enables removal of the dummy core 121 from the inner core assembly during the subsequent decap step.

An intervening non-conductive layer 140 is positioned between the dummy core 120 and the core structure 122, and an intervening non-conductive layer 142 is positioned between the dummy core 121 and the core structure 130. In the exemplary configuration shown in FIG. 8, additional conductive layer 146 and intervening non-conductive layer 138 are added to the top of the stack and additional conductive layer 148 and intervening non-conductive layer 144 are added to the bottom of the stack, where the terms top and bottom are used only in relation to the orientation shown in FIG. 8. A single lamination step results in the laminated stack shown in FIG. 8.

Figure 9:
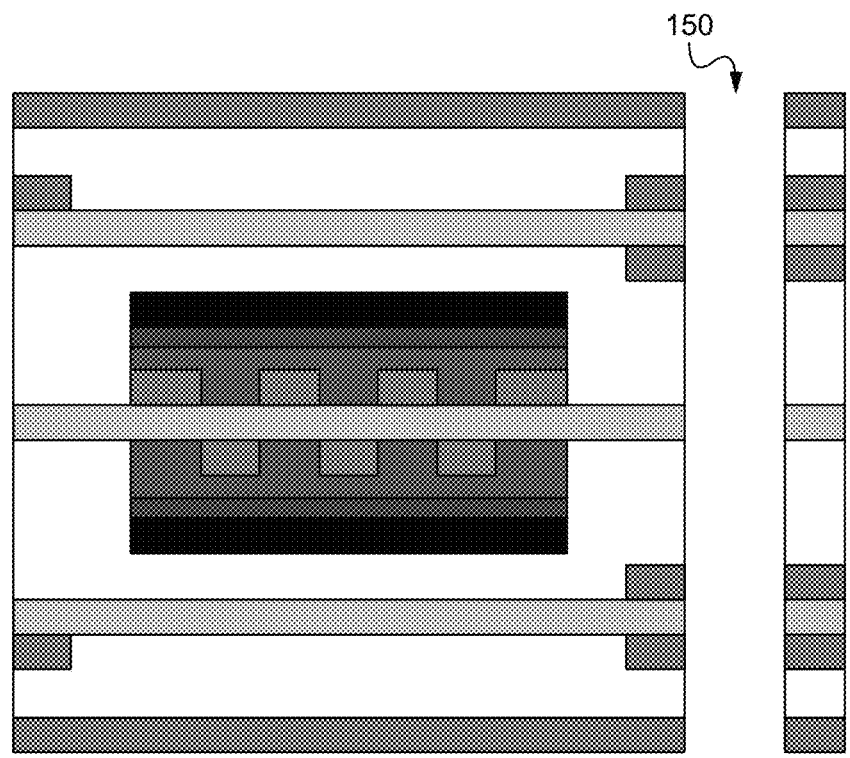

In FIG. 9, selective holes are drilled through the laminated stack of FIG. 8 to form vias, such as via 150. Vias are formed in those portions of the printed circuit board that will be rigid PCB portions.

Figure 10:
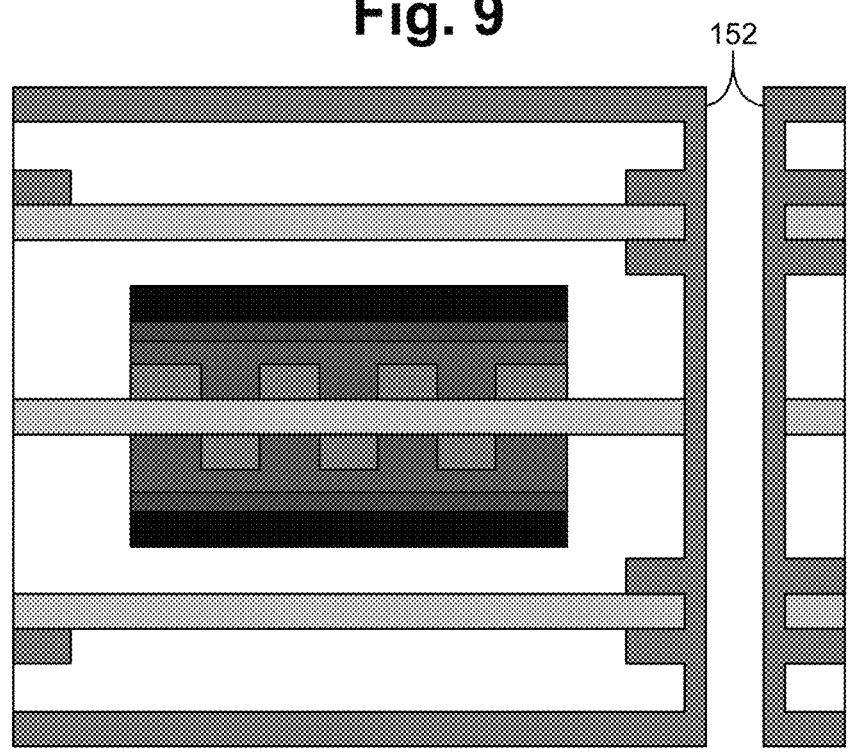

In FIG. 10, a desmear process is performed to remove residue, such as residual particles from the drilling of via 150. Next, an electroless plating process is performed to form plating 152 on the side walls of the via 150. In some embodiments, copper is used as the plating material. It is understood that other plating materials can be used. The plating 152 forms an interconnect with various conductive layers in the stack.

Figure 11:
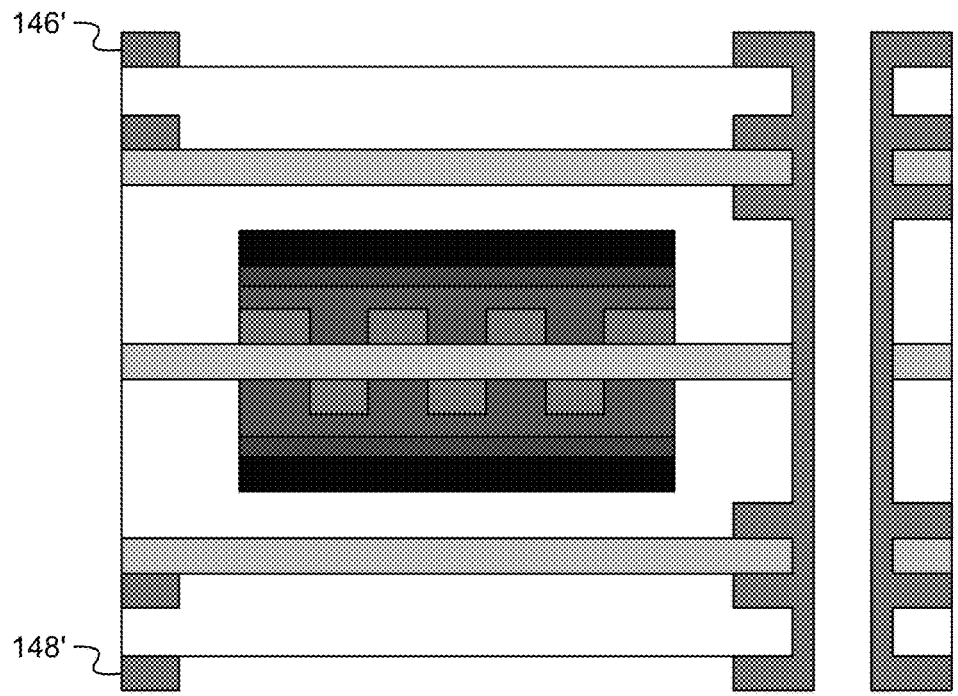

In FIG. 11, an outer conducting layer etching process is performed. The additional conductive layers 146 and 148 on the top and bottom, respectively, of the laminated stack are pattern etched to form patterned conductive layers 146' and 148'. In particular, the portions of the conductive layers 146 and 148 aligned with the dummy cores 120 and 121, respectively, are removed.

Figure 12:
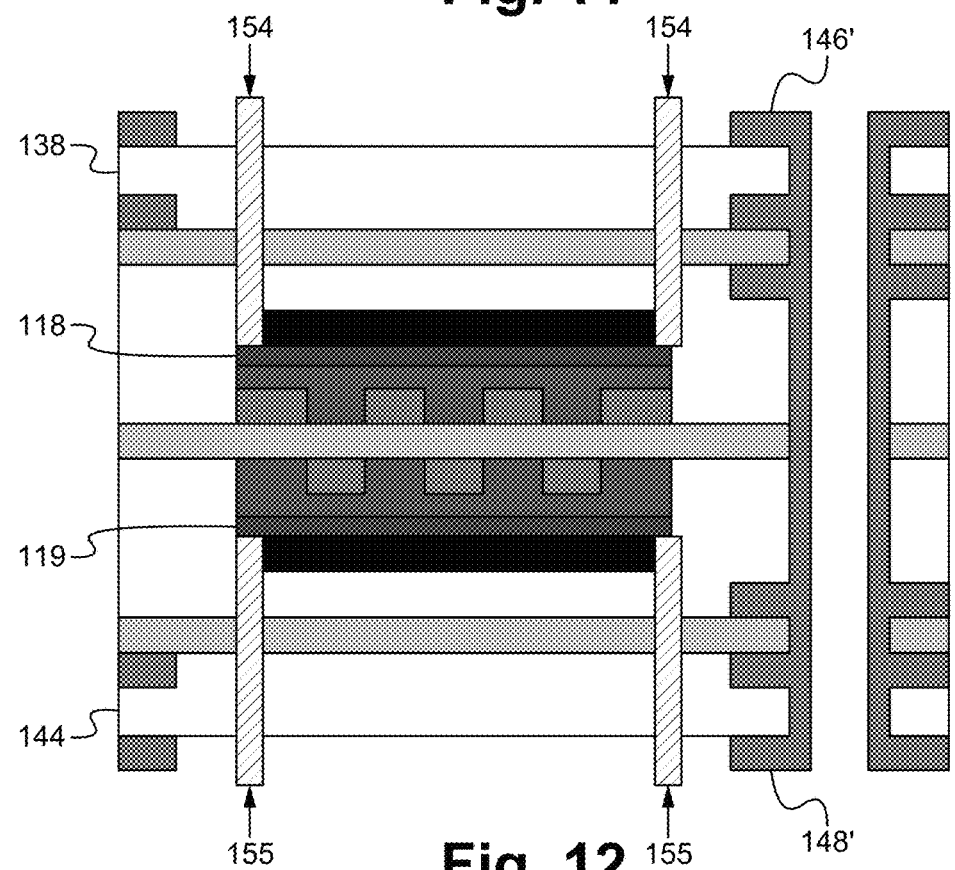
Figure 13:
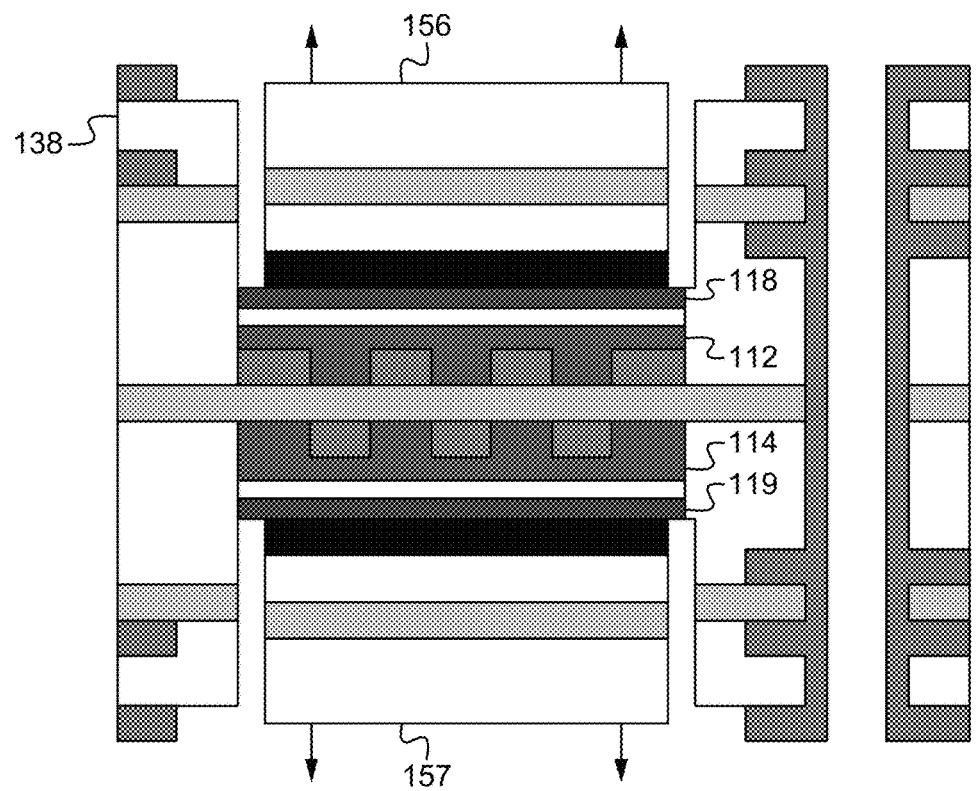

In FIG. 12, a depth controlled rout step is performed. In some embodiments, a routing tool having a rout bit is used form a rout into the laminated stack to a depth of the conductive layer on the respective dummy core. As shown in FIG. 12, a rout 154 is made from the non-conductive layer 138 to the conductive layer 118 of the dummy core 120, and a rout 155 is made from the non-conductive layer 144 to the conductive layer 119 of the dummy core 121. FIG. 12 shows a two dimensional view of the rout 154 and 155. In three-dimensions, the routs 154 and 155 are formed at an outer perimeter of the dummy cores 120 and 121, respectively. A lateral rout is also performed such that the conductive layers 118 and 119 are free from surrounding prepreg material In FIG. 13, a plug 156 is removed and a plug 157 is removed, thereby exposing the plating resist 112 and 114, respectively. The plug 156 is the area within the rout 154 perimeter and between the non-conducive layer 138 and the conductive layer 118 of the dummy core 120. The plug 157 is the area within the rout 155 perimeter and between the non-conductive layer 144 and the conductive layer 119 of the dummy core 121. Removal of the plugs 156 and 157 is referred to as a decap process. The low adhesion between the conductive layer 118 and the plating resist 112, and between the conductive layer 119 and the plating resist 114 enables the plugs to simply be pulled apart from the plating resist.

Figure 14:
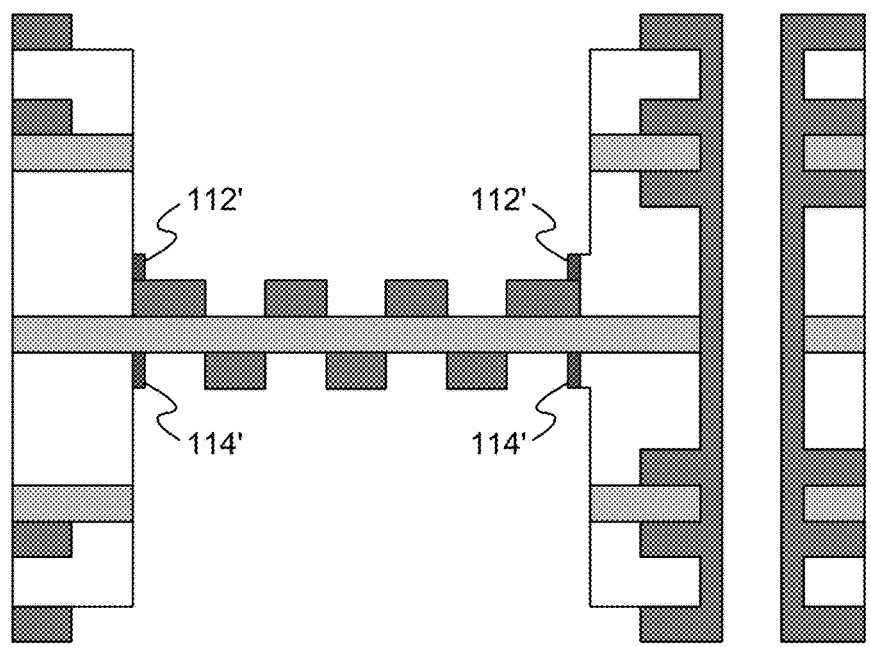

In FIG. 14, a plating resist stripping process is performed. During the plating resist stripping process, the plating resist 112 and the plating resist 114 are removed. In some embodiments, trace amounts of the plating resist remain at the boundaries, such as the plating resist 112' and 114' shown in FIG. 14. During the lamination process, such as in FIG. 8, prepreg resin binds to plating resist such that it is not easy to remove plating resist completely without long stripping time. However, long stripping time could damage proximal non-conductive layers. Therefore a shorter stripping time is used which results in trace amount of plating resist left behind. The remaining plating resist does not affect finished printed circuit board functionality.

It is understood that the various structural configurations and the position of the inner core assembly shown in the embodiments of FIGS. 5-14 can be interchanged according to a specific application and application requirement.

FIGS. 2-14 show an exemplary configuration where both sides of the inner core circuitry are protected using plating resist and dummy core, and subsequently exposed. This is referred to as a double-sided configuration In other embodiments, only one side of the inner core circuitry is protected using plating resist and dummy core, and subsequently exposed. This is referred to as a single-sided configuration. In such a single-sided application, plating resist and a dummy core are only applied over the one side of the inner core circuitry to be exposed, and the corresponding single plug is removed. FIGS. 15-24 illustrate various steps in the process used to manufacture a printed circuit board according to other embodiments. The printed circuit board manufactured using the various steps shown in FIGS. 15-24 is similar to and shares features of the printed circuit board and constituent layers shown in FIGS. 5-14 except that the FIGS. 15-24 are directed to a single-sided process. Each of the FIGS. 15-24 illustrate a cut out side view of the printed circuit board according to the various process steps.

Figure 15:
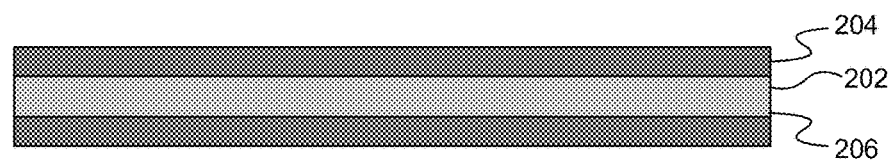
FIGS. 15-24 illustrate various steps in the process used to manufacture a printed circuit board according to other embodiments.

In FIG. 15, an exemplary inner core structure is shown. The inner core structure is a metal clad base material including a non-conductive base material layer 202 and conductive layers 204 and 206 formed on both opposing surfaces. It is understood that an alternative inner core structure can be used which includes a conductive layer on only one surface of the non-conductive layer.

Figure 16:
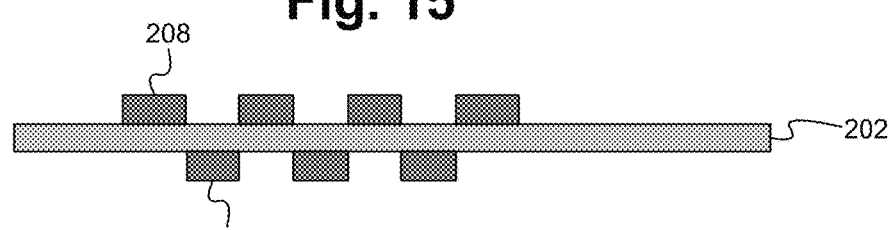

In FIG. 16, the conductive layers 204 and 206 are selectively pattern etched to form inner core circuitry 208 and 210, respectively. Alternatively, the conductive layers 204, 206 are already pattern etched during fabrication of the inner core structure in FIG. 15. It is understood that FIG. 15-24 only show a portion of the printed circuit board and in particular only show a portion of the inner core structure. Additional interconnects and circuitry may be formed on portions of the inner core structure not shown in FIGS. 15-24, those portions to be included as part of a rigid PCB portion of the printed circuit board.

Figure 17:
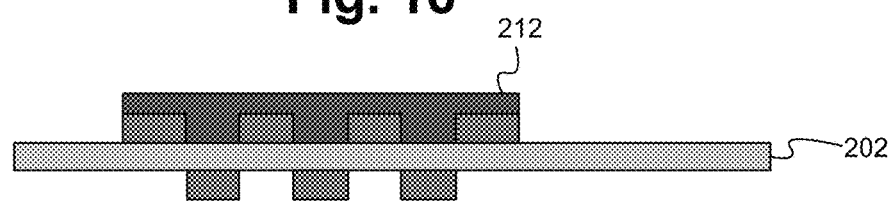

In FIG. 17, plating resist 212, such as liquid photoimageable plating resist, is applied on the inner core circuitry 208. In the single-sided embodiment, only the one side of the inner core circuitry, the inner core circuitry 208 is to be subsequently exposed, whereas the other side of the inner core circuitry, the inner core circuitry 210 is to remain embedded in the subsequent laminated stack. The resulting structure forms an inner core assembly. It is understood that other types of plating resist can be used that have a low adhesion to a conductive layer, such as copper, of a dummy core as described in detail below. In some embodiments, a portion of the plating resist 212 may extend beyond the outer edges of the inner core circuitry 208 so as to encapsulate the inner core circuitry 208.

Figure 18:
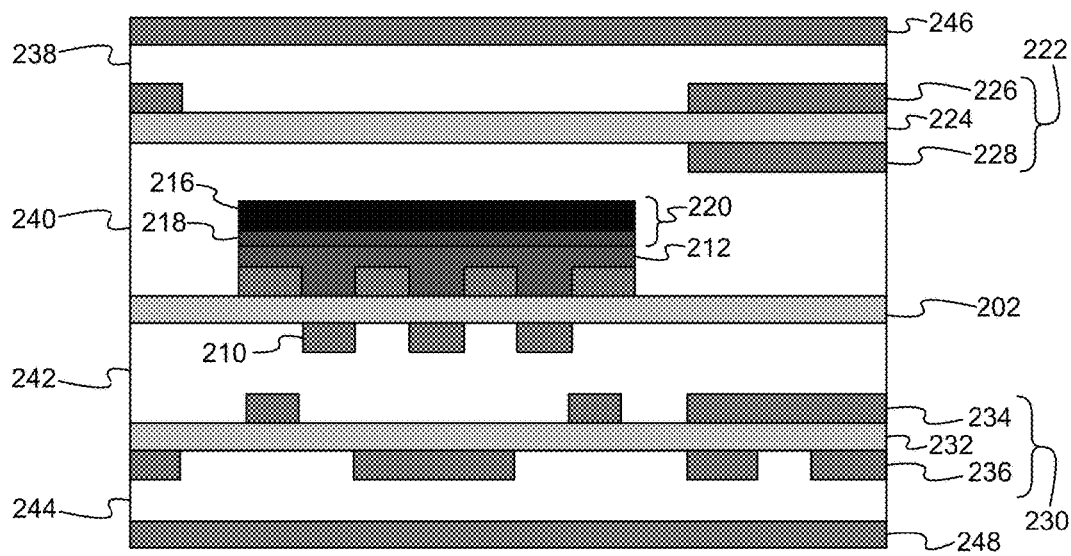

In FIG. 18, additional core structures and a dummy core structure are fabricated, and the core structures, the inner core assembly and the dummy core structure are stacked with intervening non-conductive layers. The additional core structures are similar to the inner core structure of FIG. 15 with the conductive layers pattern etched accordingly. However, the conductive layers of the additional core structures positioned are formed such that the resulting interconnects will be positioned in a rigid PCB portion of the resulting printed circuit board. In those additional core structures that include portions of a subsequent plug to be removed during a decap process, the corresponding conductive layer portions can be etched away or left intact. In the exemplary configuration shown in FIG. 18, two additional core structures are included. A first core structure 222 includes a non-conductive layer 224 and conductive layers 226 and 228. The conductive layers 226 and 228 are selectively pattern etched. As shown in FIG. 18, the portions of the conductive layers 226 and 228 aligned with the inner core circuitry 208 are removed. Alternatively, the portions of the conductive layers 226 and 228 aligned with the inner core circuitry 208 can be left intact. A second core structure 230 includes a non-conductive layer 232 and conductive layers 234 and 236. The conductive layers 234 and 236 are selectively pattern etched. As shown in FIG. 18, the portions of the conductive layers 234 and 236 aligned with the inner core circuitry 210 may include patterned interconnects.

A dummy core 220 is positioned on the plating resist 212 of the inner core assembly. The dummy core 220 includes a conductive layer 218 and a non-conductive layer 216. The dummy core 220 is oriented such that the conductive layer 218 is positioned against the plating resist 212. The type of plating resist used has a low adhesion to the material type of the conductive layer 218. This low adhesion enables removal of the dummy core from the inner core assembly during a subsequent decap step shown and described in relation to FIG. 23.

An intervening non-conductive layer 240 is positioned between the dummy core 220 and the core structure 222, and an intervening non-conductive layer 242 is positioned between the inner core circuitry 210 and the core structure 230. In the exemplary configuration shown in FIG. 18, additional conductive layer 246 and intervening non-conductive layer 238 are added to the top of the stack and additional conductive layer 248 and intervening non-conductive layer 244 are added to the bottom of the stack, where the terms top and bottom are used only in relation to the orientation shown in FIG. 18. A single lamination step results in the laminated stack shown in FIG. 18.

Figure 19:
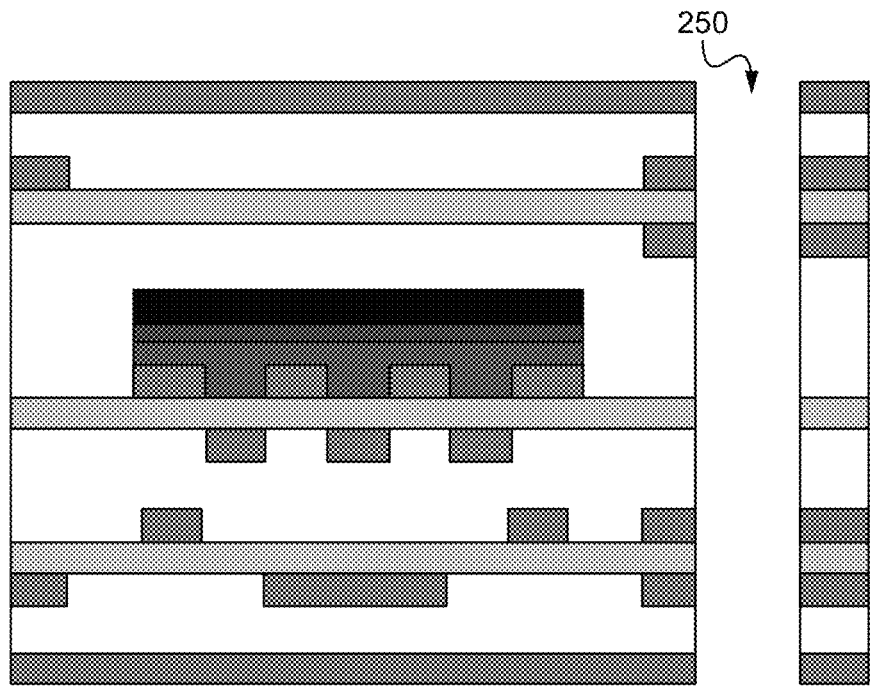

In FIG. 19, selective holes are drilled through the laminated stack of FIG. 18 to form vias, such as via 250. Vias are formed in those portions of the printed circuit board that will be rigid PCB portions.

Figure 20:
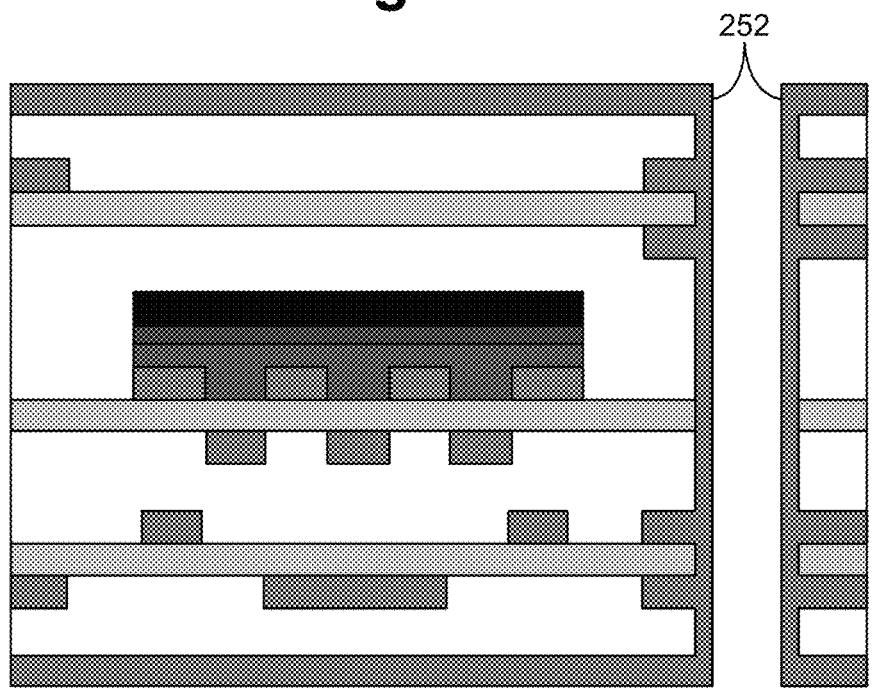

In FIG. 20, a desmear process is performed to remove residue, such as residual particles from the drilling of via 250. Next, an electroless plating process is performed to form plating 252 on the side walls of the via 250. In some embodiments, copper is used as the plating material. It is understood that other plating materials can be used. The plating 252 forms an interconnect with various conductive layers in the stack.

Figure 21:
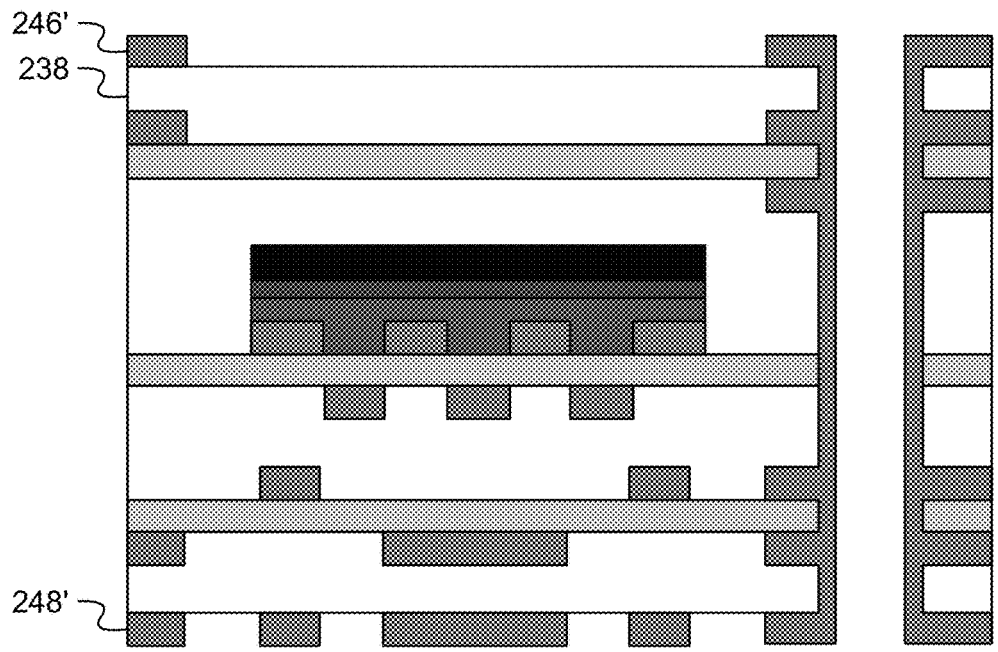

In FIG. 21, an outer conducting layer etching process is performed. The additional conductive layers 246 and 248 on the top and bottom, respectively, of the laminated stack are pattern etched to form patterned conductive layers 246' and 248'. In particular, the portion of the conductive layers 246 aligned with the dummy core 220 is removed.

Figure 22:
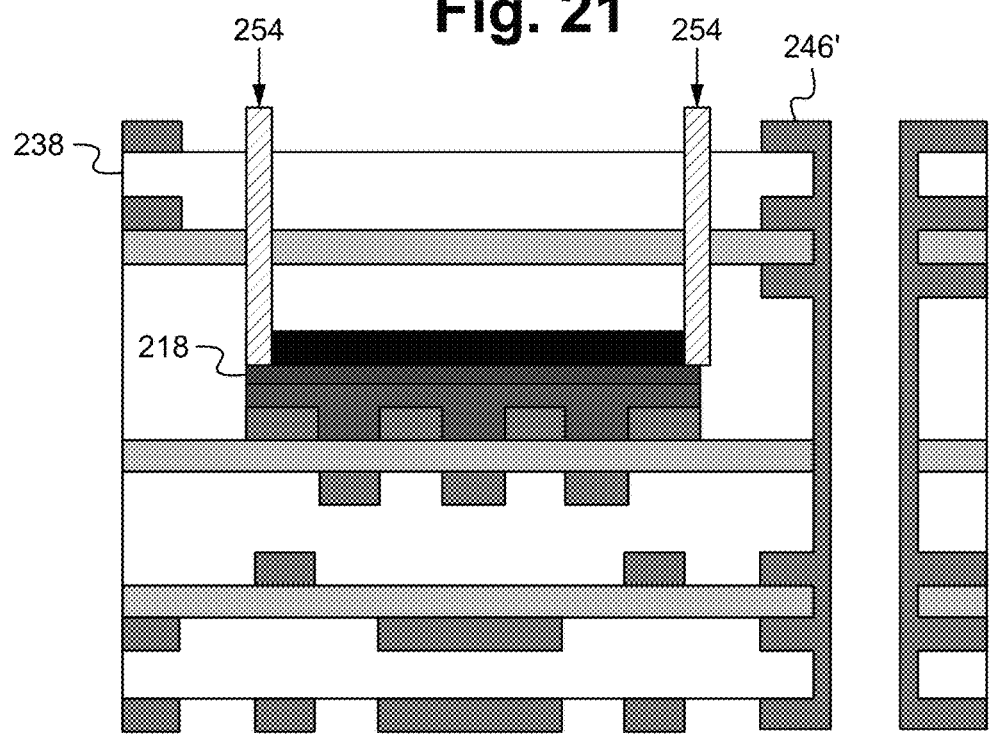

In FIG. 22, a depth controlled rout step is performed. As shown in FIG. 22, a rout 254 is made from the non-conductive layer 238 to the conductive layer 218 of the dummy core 220.

FIG. 22 shows a two dimensional view of the rout 154. In three-dimensions, the rout 154 is formed at an outer perimeter of the dummy core 220.

Figure 23:
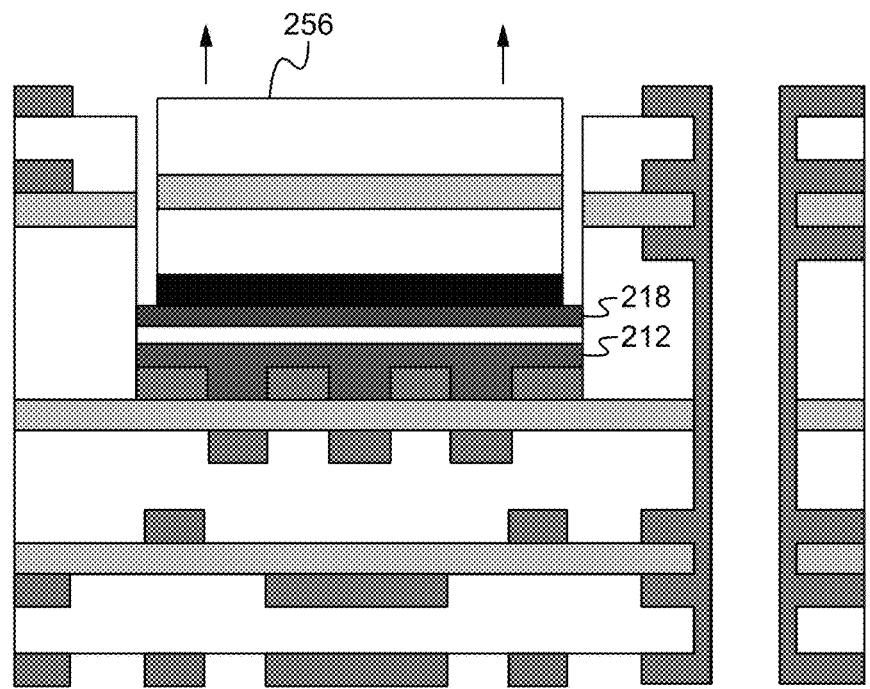

In FIG. 23, a plug 256 is removed, thereby exposing the plating resist 212. The plug 256 is the area within the rout 254 perimeter and between the non-conducive layer 238 and the conductive layer 218 of the dummy core 220. The low adhesion between the conductive layer 218 and the plating resist 212 enables the plug to simply be pulled apart from the plating resist.

Figure 24:
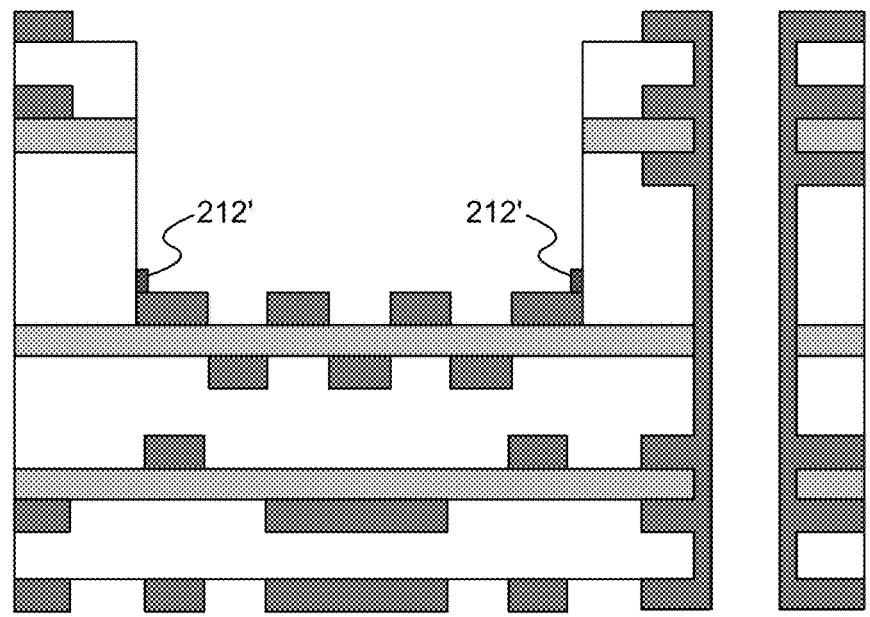

In FIG. 24, a plating resist stripping process is performed. During the plating resist stripping process, the plating resist 212 is removed. In some embodiments, trace amounts of the plating resist remain at the boundaries, such as the plating resist 212' shown in FIG. 24.

It is understood that the various structural configurations and the position of the inner core assembly shown in the embodiments of FIGS. 15-24 can be interchanged according to a specific application and application requirement.

Figure 25:
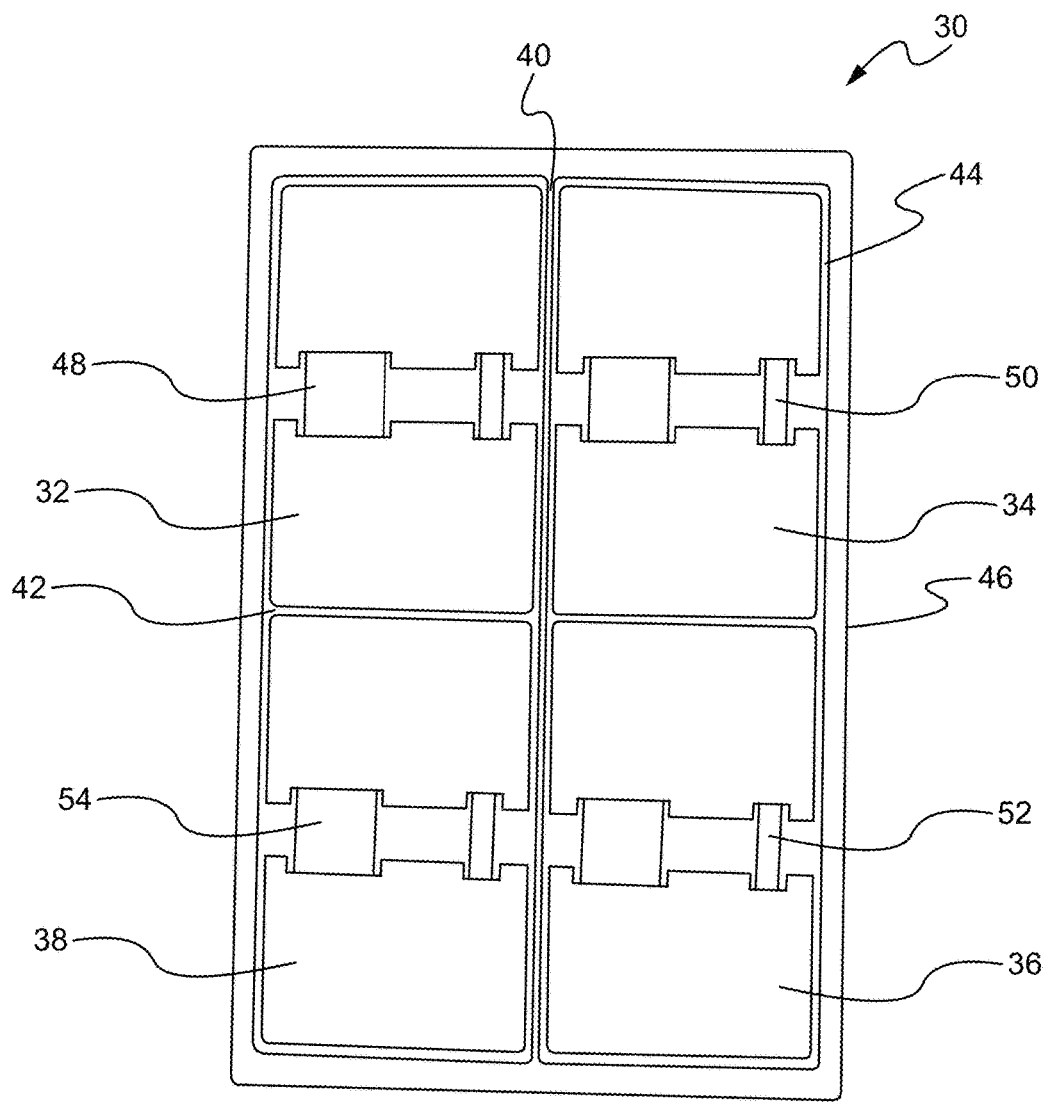
FIG. 25 illustrates an exemplary PCB set form according to an embodiment.

In some manufacturing processes, multiple PCBs are manufactured as discrete portions of a single substrate, which are separated into individual PCBs at the end of the manufacturing process. Such a single substrate configuration is referred to as a PCB set form. FIG. 25 illustrates an exemplary PCB set form according to an embodiment. The exemplary PCB set form 30 includes four PCBs 32, 34, 36, 38. It is understood that PCB set forms can include more or less than the exemplary four PCBs shown in FIG. 25. The PCBs 32, 34, 36, 38 are connected physically but not electrically. Each PCB 32, 34, 36, 38 includes exposed inner core circuitry 48, 50, 52, 54, respectively. In some embodiments, an additional routing step is applied to an outer perimeter portion of a PCB set form. The additional routing step can be performed at any point in the printed circuit board manufacturing process after the lamination step is performed. For example, in the printed circuit board manufacturing process shown in FIGS. 5-14, the additional routing step can be performed at any point after the lamination step shown in FIG. 8. The additional routing step removes a perimeter portion of the laminated PCB stack up including the outer perimeter portion of the dummy core pattern, such as the outer perimeter portion 12 of FIG. 1. A resulting perimeter area surrounding the PCBs 32, 34, 36, 38 in the PCB set form 30 is shown in FIG. 25 as breakaway area 46.

The PCBs 32, 34, 36, 38 are ready for surface components to be mounted on select areas, such as through a surface mount technology (SMT) process. After the components are mounted, the PCBs are separated for subsequent installation into other devices. Separating the PCBs can be performed using any conventional process including, but not limited to, cutting the PCB set form 30 along etched lines 40, 42, 44. Cutting along the perimeter etch lines 44 separates the breakaway area 46 from the PCBs 32, 34, 36, 38, and cutting along the etch lines 40, 42 separates the PCBs 32, 34, 36, 38 from each other.

Figure 26:
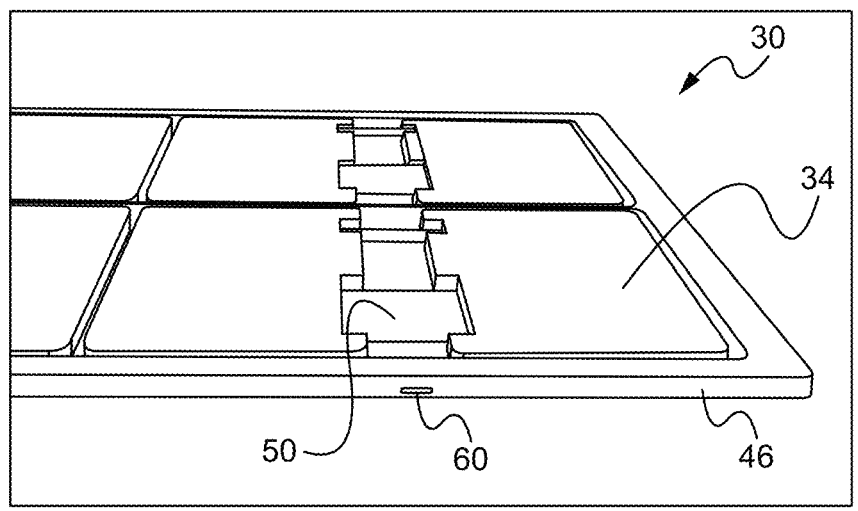
FIG. 26 illustrates a perspective side view of the PCB set form 30 of FIG. 25.

FIG. 26 illustrates a perspective side view of the PCB set form 30 of FIG. 25. The breakaway area 46 includes a dummy core portion 60, which is a remnant of a dummy core pattern used to form the exposed inner core circuitry 50 in the PCB 34. As exemplified in FIG. 1, a dummy core pattern can include an interconnect portion, such as the interconnect portion 10 of the dummy core pattern 6 in FIG. 1, a portion of which coincides with the breakaway area of a PCB set form, such as the breakaway area 46 in FIG. 26. As such, although the outer perimeter portion of the dummy core pattern, such as the outer perimeter portion 12 in FIG. 1, as well as the overlay portions of the dummy core pattern that are applied over the plating resist and corresponding inner core circuitry, such as the overlay portions 8 in FIG. 1, are removed during the PCB manufacturing process, the interconnect portions that connect to the outer perimeter portion of the dummy core pattern remain.

In some embodiments, the semi-flex PCB portions can be formed as connector sections between rigid PCB portions, such as the configuration shown in FIG. 25. The semi-flex PCB portion is flexible thereby enabling two adjoining rigid PCB portions to rotate, or pivot, relative to each other In other embodiments, the portion of the printed circuit board corresponding to the exposed inner core circuitry is rigid, referred to as a rigid exposed circuitry PCB portion. The rigid exposed circuitry PCB portion can be formed as the outer perimeter of a rigid PCB portion, such as the formation of recessed gold fingers used for subsequent interconnection with other devices. Gold fingers are elongated conductors. The recessed gold fingers can be formed using either the single sided configuration or the double sided configuration.

An advantage of using the plating resist and dummy core in the manufacturing process is that relatively early in the manufacturing process a final circuit surface, for example the inner core circuitry, can be prepared and protected during subsequent process steps. The final circuit surface can be re-exposed later in the process without having been contaminated.

The present application has been described in terms of specific embodiments incorporating details to facilitate the understanding of the principles of construction and operation of the printed circuit board. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A printed circuit board comprising:
    a. a rigid printed circuit board portion comprising a laminated stack of a plurality of non-conducting layers and a plurality of conductive layers, wherein the laminated stack further comprises a first portion of an inner core structure; and
    b. a semi-flexible printed circuit board portion comprising a second portion of the inner core structure and exposed plating resist, wherein the inner core structure is a continuous structure that extends through both the rigid printed circuit board portion and the semi-flexible printed circuit board portion, further wherein the second portion of the inner core structure comprises exposed inner core circuitry, wherein the plating resist is limited to the semi-flexible printed circuit board portion of the printed circuit board and is limited to contacting a side wall of the rigid circuit board portion corresponding to a non-conducting layer of the rigid printed circuit board portion and the second portion of the inner core structure immediately adjacent the side wall of the rigid circuit board portion, further wherein the inner core structure comprises an inner core non-conductive layer having a first surface and a second surface opposite the first surface, and the first surface and the second surface of the inner core non-conductive layer form a continuous planar surface across the entire semi-flexible printed circuit board portion.

2. The printed circuit board of claim 1 wherein each of the conductive layers is pattern etched.

3. The printed circuit board of claim 1 further comprising one or more plated through hole vias in the rigid printed circuit board portion.

4. The printed circuit board of claim 1 wherein the rigid printed circuit board portion comprises a first rigid printed circuit board portion, further wherein the printed circuit board further comprises a second rigid printed circuit board portion comprising a second laminated stack of a plurality of non-conducting layers and a plurality of conductive layers, wherein the second laminated stack further comprises a third portion of an inner core structure.

5. The printed circuit board of claim 1 wherein the inner core structure further comprises a first conductive layer positioned on the first surface of the inner core non-conductive layer.

6. The printed circuit board of claim 5 wherein the first conductive layer of the inner core structure comprises the inner core circuitry in the second portion of the inner core structure.

7. The printed circuit board of claim 6 wherein the inner core structure further comprises a second conductive layer positioned on the second surface of the inner core non-conductive layer.

8. The printed circuit board of claim 7 wherein the second conductive layer of the inner core structure comprises the inner core circuitry in the second portion of the inner core structure, wherein the plating resist is coupled to both the first surface and the second surface of the inner core non-conductive layer within the second portion of the inner core structure.

\* \* \* \* \*